(12) United States Patent
Lin

(10) Patent No.: US 6,498,577 B1
(45) Date of Patent: Dec. 24, 2002

(54) PIECEWISE-LINEAR, NON-UNIFORM ADC

(75) Inventor: Leon Chia-Liang Lin, Union City, CA (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/051,736

(22) Filed: Jan. 16, 2002

(51) Int. Cl.[7] ................................................ H03M 1/12
(52) U.S. Cl. ...................... 341/156; 341/155; 341/138; 341/144; 341/108
(58) Field of Search ................................ 341/155, 138, 341/156, 144, 108

(56) References Cited

U.S. PATENT DOCUMENTS 4,250,492 A * 2/1981 Yamakido et al. .......... 341/108
5,019,821 A * 5/1991 Sugimoto .................... 341/156
6,295,013 B1 * 9/2001 Barna et al. ................. 341/138

* cited by examiner

Primary Examiner—Michael Tokar
Assistant Examiner—Lam Mai
(74) Attorney, Agent, or Firm—Stanton Braden

(57) ABSTRACT

A non-uniform analog-to-digital converter (ADC) produces digital output data representing the magnitude of an analog input signal having a non-uniform magnitude probability distribution. The digital output data represents the analog input signal with relatively high resolution for the input signal's more frequently occurring magnitudes and with relatively lower resolution for the input signals less frequently occurring magnitudes.

20 Claims, 7 Drawing Sheets

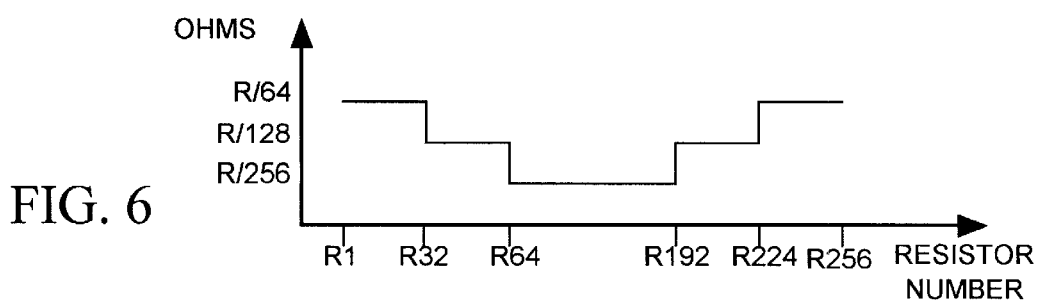
FIG. 6
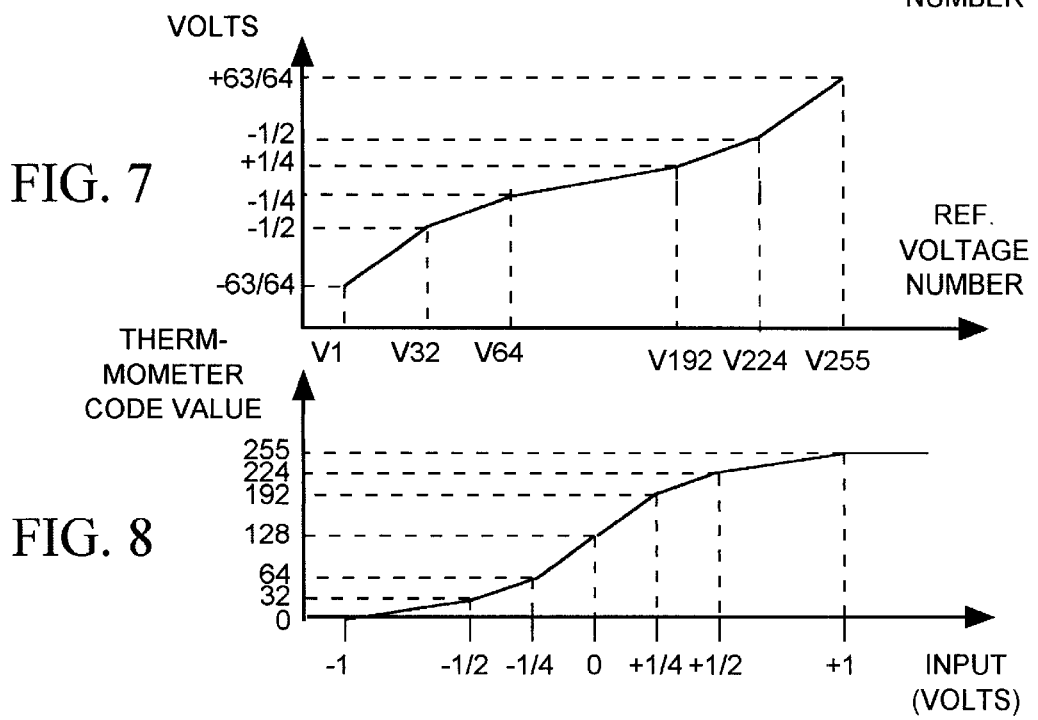
FIG. 7
FIG. 8
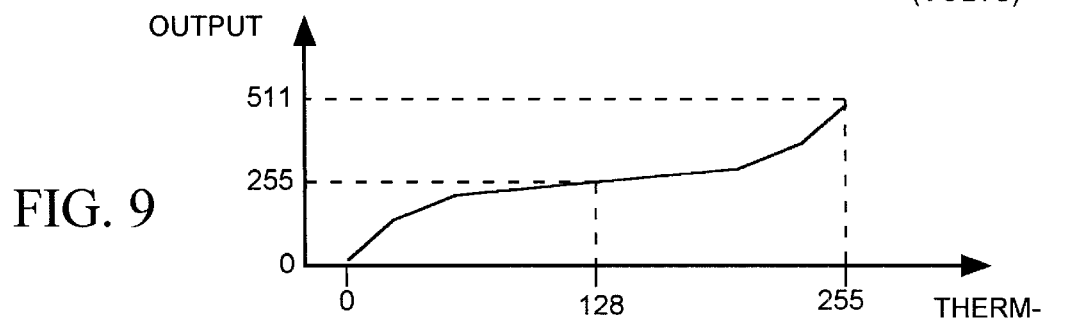
FIG. 9
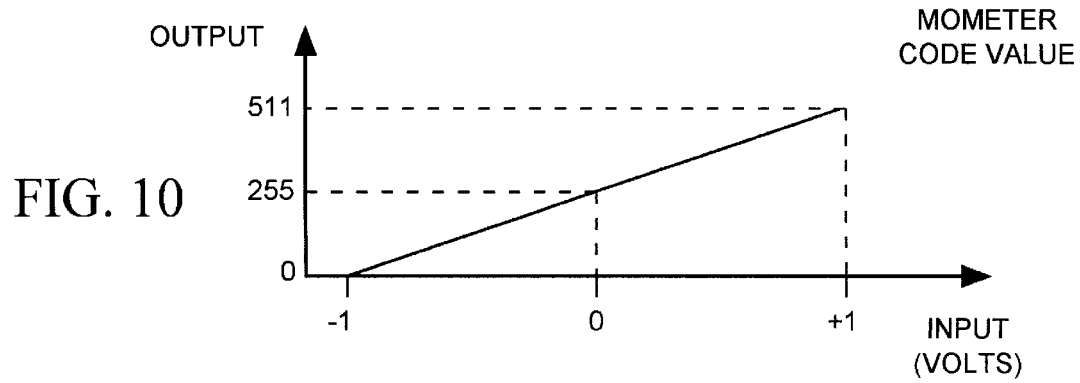
FIG. 10

PIECEWISE-LINEAR, NON-UNIFORM ADC

BACKGROUND OF THE INVENTION

1. Field of the Invention

The present invention relates in general to an analog-to-digital converter (ADC), and in particular to an ADC providing a non-uniform quantization step size over its input magnitude range, resulting in a non-linear relationship between the magnitude of its input analog signal and the value of its digital output data.

2. Description of Related Art

Figure 1:
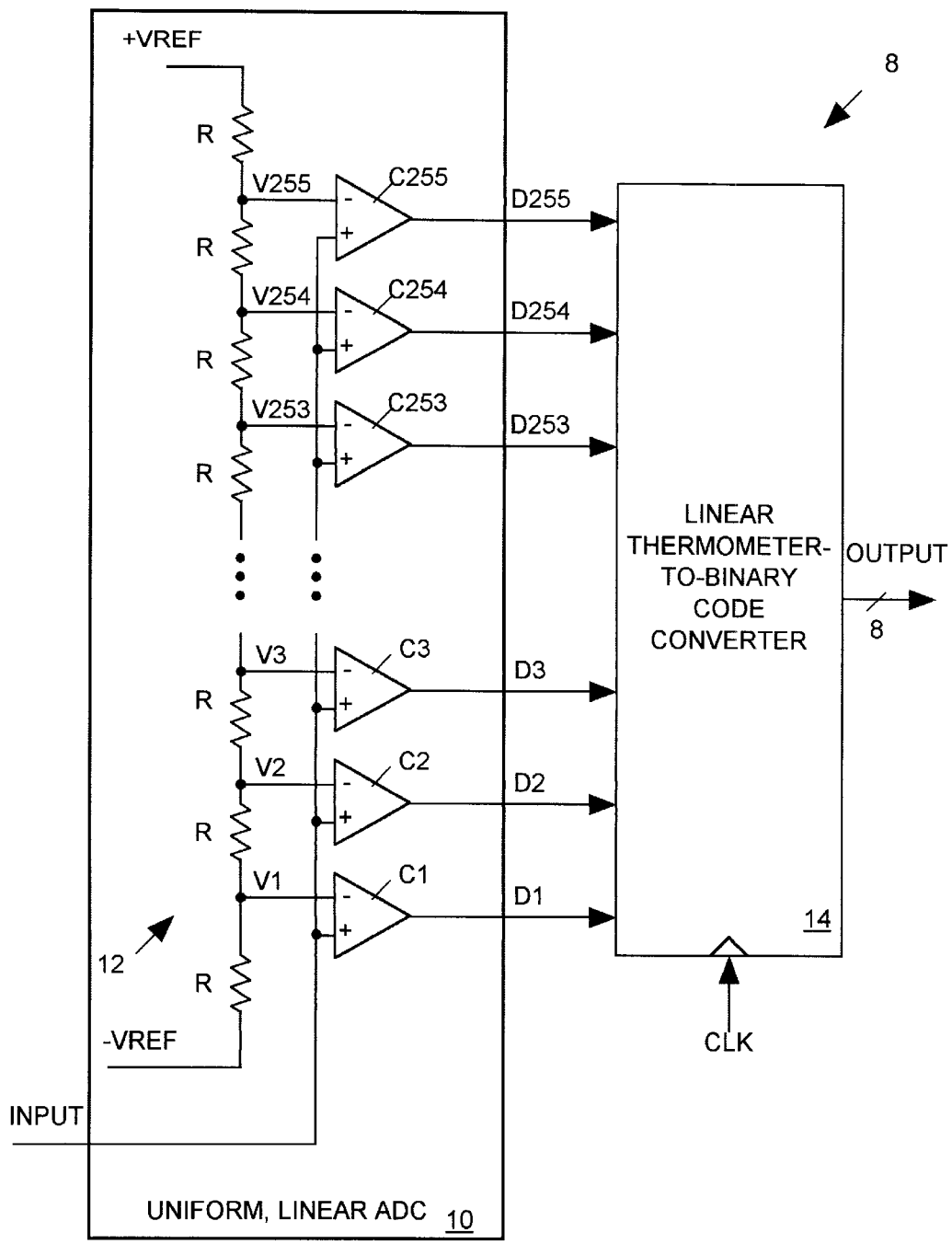

FIG. 1 illustrates a conventional digitizer 8 including an analog-to-digital converter (ADC) 10 for producing 255-bit thermometer code (D255 . . . D1) representing the voltage magnitude of an analog input signal (INPUT). In response to each edge of an input clock signal (CLK) a linear thermometer-to-binary code converter 14 converts the 255-bit thermometer code into an 8-bit binary output data OUTPUT representing the INPUT signal magnitude.

ADC 10 includes a voltage divider 12 formed by a series of 256 resistors of similar magnitude R linked between reference voltages +VREF and −VREF to generate a set of 255 reference voltages V1–V255 that are uniformly distributed within the range [−VREF, +VREF]. Each of a set of 255 comparators C1–C255 compares a corresponding one of reference voltages V1–V255 to the INPUT signal voltage and generates a corresponding one of data bits D1–D255. Each voltage comparator C1–C255 drives its output data bit to a "1" logic state when the INPUT signal voltage exceeds the comparators input reference voltage V1–V255 and drives its output data bit to a "0" logic state when the INPUT signal voltage is lower than its reference voltage. Converter 14 converts the 255-bit thermometer code formed by data bits D1–D255 into a corresponding 8-bit binary code ranging in value from 0 to 255.

Table I below lists values of the 255-bit thermometer code (D255... D1) and the 8-bit binary code for various voltage ranges of the INPUT signal when, for example, +VREF=+1 volt and −VREF=−1 volt.

TABLE I

| INPUT | (D255 . . . D1) | OUTPUT |
|---|---|---|
| −1 to −127/128 | 000 . . . 0000 | 00000000 |
| −127/128 to −126/128 | 000 . . . 0001 | 00000001 |
| −126/128 to −125/128 | 000 . . . 0011 | 00000010 |
| −125/128 to −124/128 | 000 . . . 0111 | 00000011 |
| . | . | . |
| . | . | . |
| . | . | . |
| +125/128 to +126/128 | 111 . . . 1100 | 11111101 |
| +126/128 to +127/128 | 111 . . . 1110 | 11111110 |
| +127/128 to +1 | 111 . . . 1111 | 11111111 |

As illustrated in Table I, ADC 10 "quantizes" the INPUT signal voltage since each value of its OUTPUT data represents a range of INPUT signal voltages rather than a discrete voltage. ADC 10 provides "uniform quantization" since the voltage ranges represented by each thermometer code data value are of similar width. In the example illustrated in Table I, the width ("quantization step size") of each range is a uniform 1/128 volt. Thus with +VREF and −VREF set at +1 and −1 volts, the thermometer code output of ADC 10 and the 8-bit OUTPUT data of converter 14 can representing the magnitude of the INPUT signal with 1/128 volt resolution.

As discussed below, when a periodic CLK signal causes converter 14 to produce a sequence of OUTPUT data values in response to a time-varying INPUT signal, that data sequence is a somewhat distorted representation of the time-varying behavior of the INPUT signal due to the effects of "clipping noise" and "quantization noise".

Clipping Noise

With −VREF and +VREF set, for example, to −1 volt and +1 volt, ADC 10 has a [−1,+1] voltage range. When the INPUT signal magnitude occasionally swings higher than +1 volt, the resulting digitizer OUTPUT data value (11111111) will misrepresent the INPUT signal magnitude as being within the range +127/128 to +1 volt. Similarly, when the INPUT signal magnitude occasionally swings below −1 volt, the resulting binary OUTPUT data value (00000000) will misrepresent the INPUT signal magnitude as being within the range −127/128 to −1 V. Hence whenever the INPUT signal magnitude swings beyond the range of the ADC, the OUTPUT data sequence will be a "clipped" representation of the INPUT signal having flattened peaks. Thus ADC 10 introduces "clipping noise" into the OUTPUT data whenever the INPUT signal magnitude goes outside the range defined by −VREF and +VREF.

One way to avoid clipping noise is to set the ADC's voltage range at least as wide as the full range of the INPUT signal. For example FIG. 2 charts the relative probability P of each possible magnitude $V_{IN}$ of an INPUT signal when the INPUT signal's magnitude is evenly distributed in time within voltage range [−1, +1] and never goes outside that range. Obviously, if −VREF and +VREF are set to −1 V and +1 V, the OUTPUT data sequence will exhibit no clipping noise. Hence the range [−1, +1] is a good choice for ADC 10 when the INPUT signal has the uniform magnitude probability distribution of FIG. 2.

Figure 2:
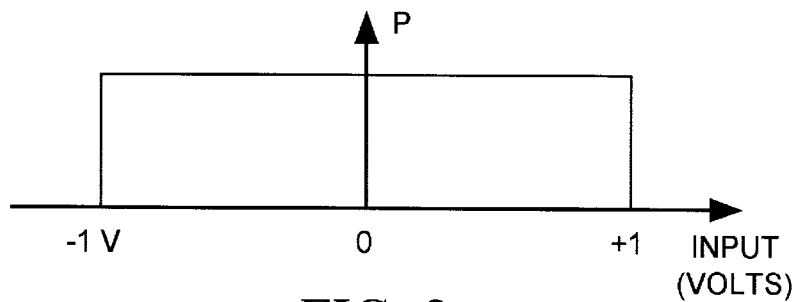
Figure 3:
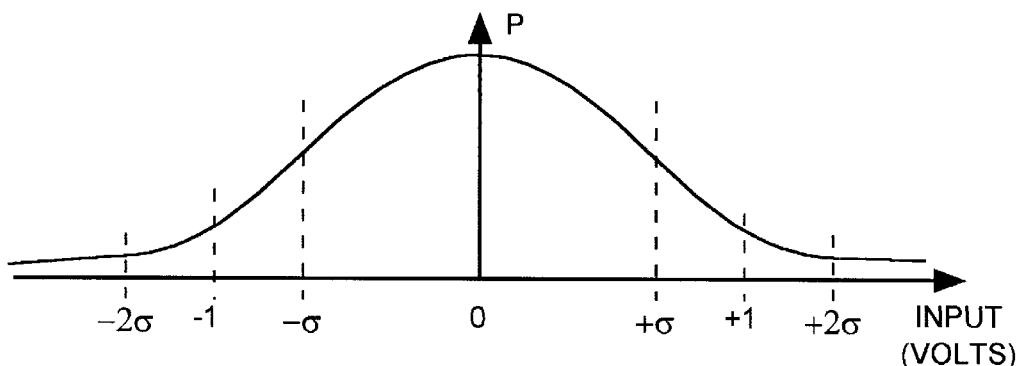
Figure 4:
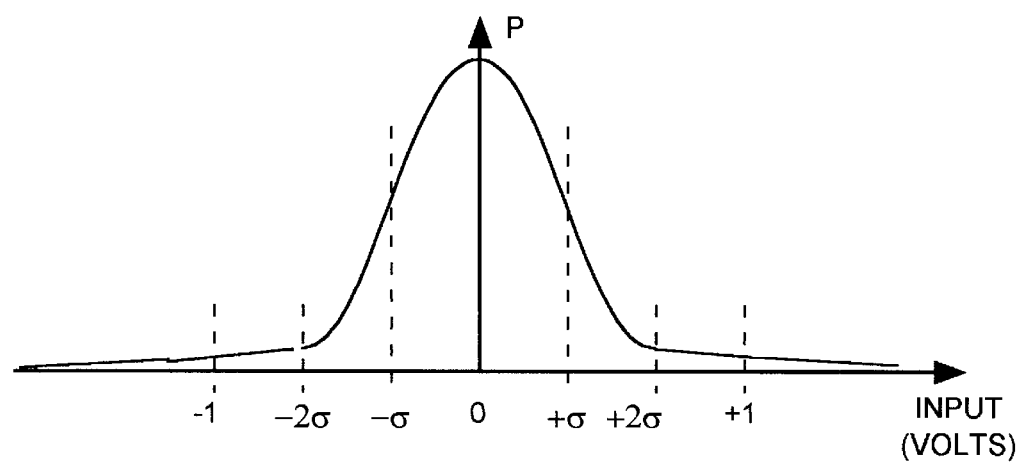

However not all signals have magnitude probability distributions that are as uniform and conveniently limited as that of FIG. 2. Signal magnitudes produced by many processes are "normally distributed" about some mean voltage. FIGS. 3 and 4 chart the probability P of each possible magnitude $V_{IN}$ of two ADC example INPUT signals, each having a magnitude normally distributed about a mean of 0 volts. The standard deviation σ of a normal distribution is measure of distribution's "flatness". A signal having a normally distributed magnitude about a mean of 0 voltage will range between +σ and −σ volts about 63.8% of the time, and will range between +2σ and −2σ volts about 95.4% of the time. FIGS. 3 and 4 indicate that the probability of occurrence is higher for INPUT signal magnitudes residing with a "high probability" portion [−σ, +σ] of the analog signal's range than for INPUT signal magnitudes residing in a "low probability" portion of the range [−2σ, −σ] or [+σ, +2σ]. Note that since the magnitude probability distribution of FIG. 3 has a larger σ than that of FIG. 4, the magnitude of a signal having the distribution of FIG. 3 will swing outside the ADC's [−1, +1] volt range much more often than a signal having the distribution of FIG. 4.

Note also that the high positive and negative voltages of a normally distributed signal are not limited as they are for a signal having the magnitude probability distribution illustrated in FIG. 2. Such a signal can have a very high negative or positive voltage, but not very often. Thus when the INPUT signal is a normally distributed signal, the choice of its voltage range [−VREF, +VREF] becomes problematic. If we make the ADC range large, we can reduce the probability that the signal will swing outside the ADC's range and therefore reduce clipping noise. But in doing so we also reduce the ADC's resolution, which as discussed below, will increase quantization noise.

Quantization Noise

"Quantization noise" arises because the ADC's output thermometer code does not have infinite resolution; it quantizes the INPUT signal magnitude by representing it as being within a particular voltage range rather than as a discrete voltage level. Quantization noise causes distortion in the ADC's OUTPUT data sequence that is a function of the magnitude of the ADC's resolution, or quantization step $\Delta$. In general the uniform quantization step $\Delta$ for a B-bit ADC (i.e., an ADC producing binary OUTPUT data having B-bits or the $2^B-1$ bit thermometer code equivalent thereof) is $$66 = 2^{-B} V_R \quad [1]$$

where $V_R$ is the range of the ADC. In the example ADC 10 of FIG. 1, where $V_R=2$ volts and B=8 equation [1] yields a quantization step size $\Delta$ of $\frac{1}{128}$ volts, consistent with the uniform step size shown in Table I.

The "mean square quantization noise" (MSQN) of an ADC is a commonly employed measure of the ADC's quantization noise, and is a function of the ADC's quantization step $\Delta$ and of the voltage distribution of the signal being digitized. For a signal having the uniform magnitude probability distribution of FIG. 2, $$MSQN = \Delta^2/12. \quad [2]$$

The "quantization signal-to-noise ratio" (QSNR) of an ADC, is a measure of the quantization noise in relation to the magnitude of the INPUT signal. In particular, QSNR is the ratio of the mean square magnitude of the INPUT signal divided by the MSQN. Since a signal having the uniform magnitude probability distribution of FIG. 2 has a mean square magnitude of $\frac{1}{3}$ volt, its QSNR is $$QSNR = (\frac{1}{3})/[\Delta^2/12] = 4/\Delta^2. \quad [3]$$

Equation [3] shows that we can increase QSNR (a desirable goal) by reducing quantization step size $\Delta$. Since the $\Delta$ of ADC 10 is equal to the ADC's voltage range [−VREF, +VREF] divided by the number (255) of reference voltages V1–V255, we can decrease $\Delta$ and therefore increase QSNR by decreasing the ADC's voltage range. However when we reduce the ADC's range below that of the INPUT signal having the uniform magnitude probability distribution illustrated in FIG. 2, ADC 10 begins to clip the INPUT signal. Thus the advantage of reducing quantization noise can be offset by the disadvantage of increasing clipping noise.

A signal having a normally distributed magnitude as illustrated in FIG. 3 or FIG. 4, will have a mean square magnitude of $12\sigma^2$. Thus when digitizing a signal having a normal magnitude distribution, ADC 10 will have a QSNR of $$QSNR = 12\sigma^2/\Delta^2. \quad [4]$$

Equation [4] indicates that a signal having a relatively flat normal magnitude probability distribution (high $\sigma$) as illustrated in FIG. 3, results in a high QSNR, which is desirable. However, as seen by comparing FIGS. 3 and 4, a higher $\sigma$ (FIG. 3) means that the ADC INPUT signal magnitude more frequently goes outside the ADC's range and that the ADC will therefore add more clipping noise to its output data.

As mentioned above, we can reduce the clipping noise generated by ADC 10 by increasing the ADC's voltage range. But in doing so we also increase the quantization step $\Delta$ and therefore decrease the ADC's QSNR, an undesirable effect. Thus choosing a reference voltage range [−VREF,+VREF] when ADC 10 is digitizing a signal having a normal magnitude probability distribution involves a trade-off between the effects of quantization and clipping noise.

One way to greatly reduce quantization noise without increasing the amount of clipping noise is to increase the ADC's resolution, thereby decreasing quantization step $\Delta$ in equation [4]. For example, since the width of the quantization step of a 9-bit ADC is one half that of an 8-bit ADC, equation [4] tells us that a 9-bit ADC will have a four times higher QSNR than an 8-bit ADC given similar normally distributed INPUT signal. But to turn the 8-bit ADC 10 of FIG. 1 into a 9-bit ADC, we must double the number of its resistors and comparators. Hence increasing the ADC's resolution is a heavy price to pay for increasing the ADC's signal-to-noise ratio.

What is needed is a way to improve an ADC's signal-to-noise ratio when digitizing a signal having a non-uniformly distributed magnitude without also increasing its clipping noise, and without having to substantially increase the ADC's component count.

BRIEF SUMMARY OF THE INVENTION

The invention relates to a method and apparatus for generating digital data representing the magnitude of an analog signal having a voltage that varies with time over some voltage range of interest. The invention is particularly well-suited for digitizing an analog signal having a non-uniform voltage probability distribution in which the probability of occurrence of any signal voltage residing within a "high probability" portion of the range of interest is higher than the probability of occurrence of a signal voltage residing within a "low probability" portion of the range of interest.

In accordance with one aspect of the invention, the apparatus generates a set of reference signals having voltages that are non-uniformly distributed over the range of interest so that reference signal voltages within high probability portions of the range are more closely spaced than reference signal voltages residing within low probability portions of the range of interest.

The apparatus compares the analog signal voltage to the reference signal voltages to determine which two reference signal voltages most closely bound the analog signal voltage. The apparatus produces digital output data represent the magnitude of the analog signal as lying within the range of bounded by two reference signal voltages.

Since the reference signal voltages are most closely spaced within the high probability portions of the analog signal's voltage range, the digital data represents the analog signal magnitude with higher resolution when the analog signal resides within a high probability portion of its range than when the magnitude resides outside that portion of its range.

As a result of the non-uniform distribution of the reference voltages, the signal-to-noise ratio of the ADC's output data is greater than that of prior art ADCs employing a similar number of reference voltages that are uniformly distributed over the range of interest.

It is accordingly an object of the invention to provide an apparatus for digitizing an analog signal having a magnitude that is non-uniformly distributed over its range.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

BRIEF DESCRIPTION OF THE DRAWING(S)

Figure 5:
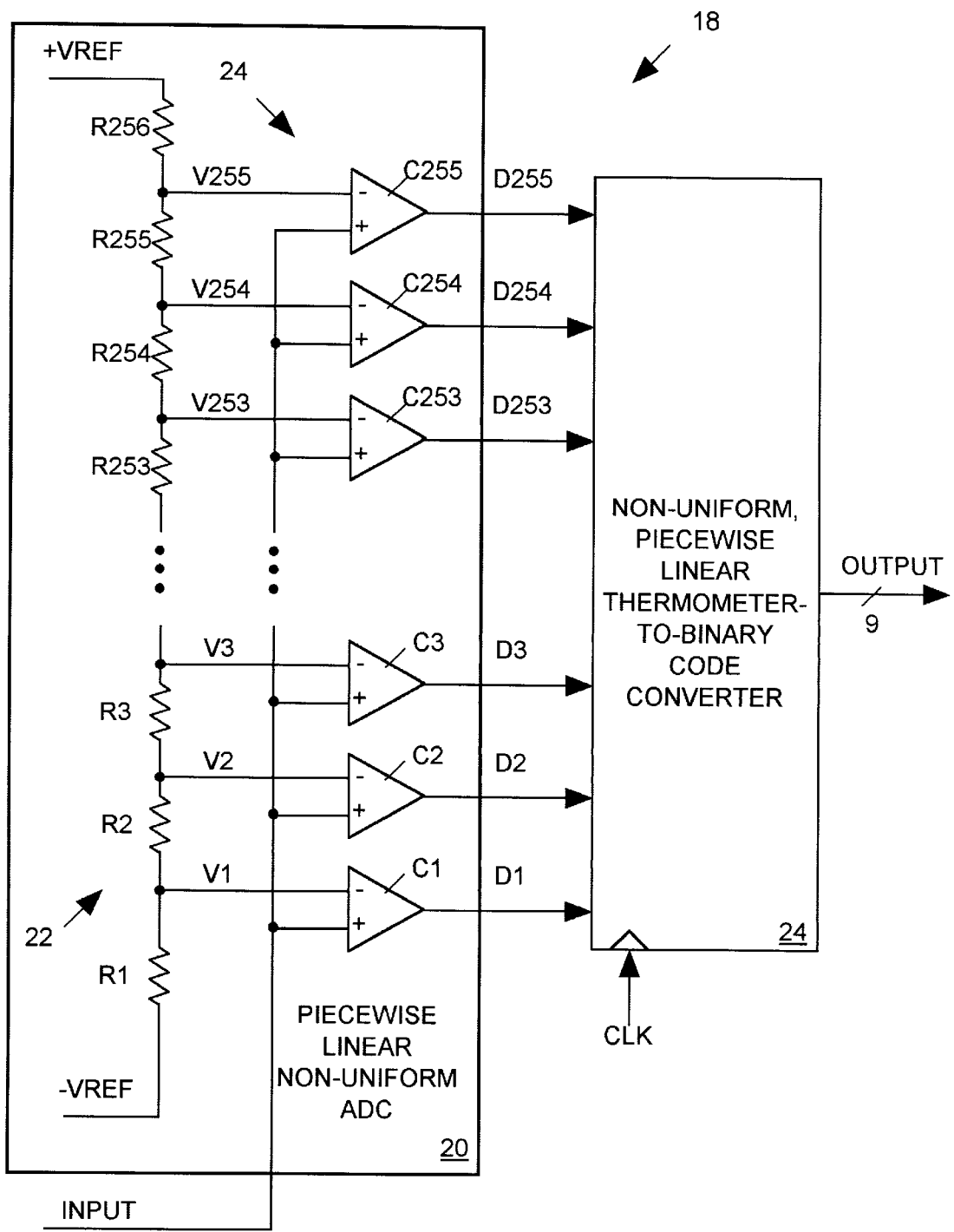
Figure 11:
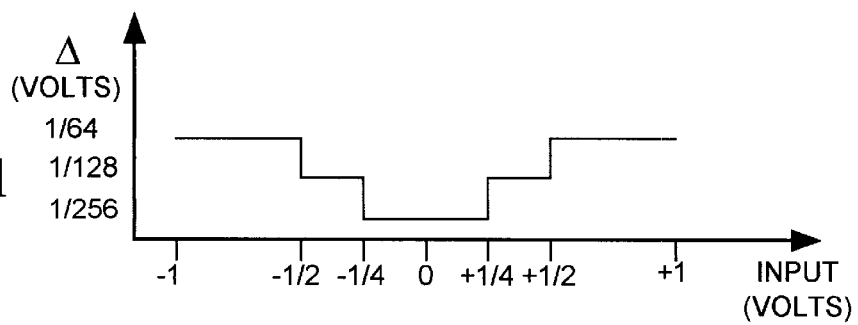
Figure 12:
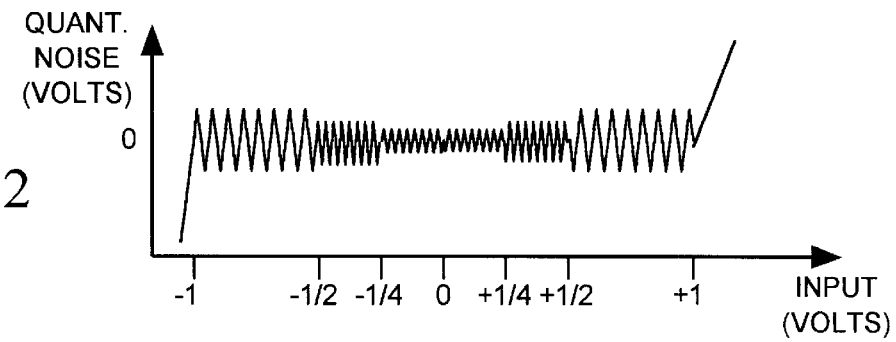
Figure 13:
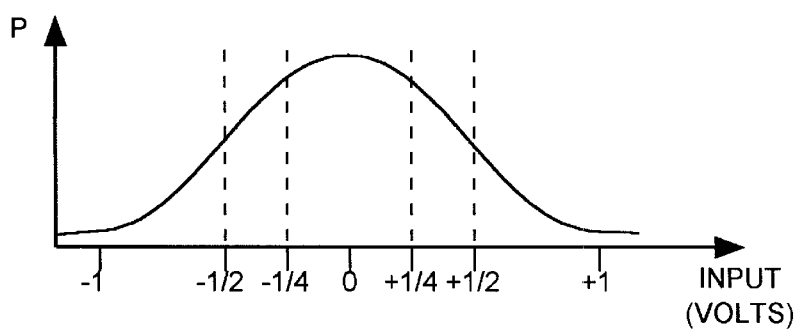
Figure 14:
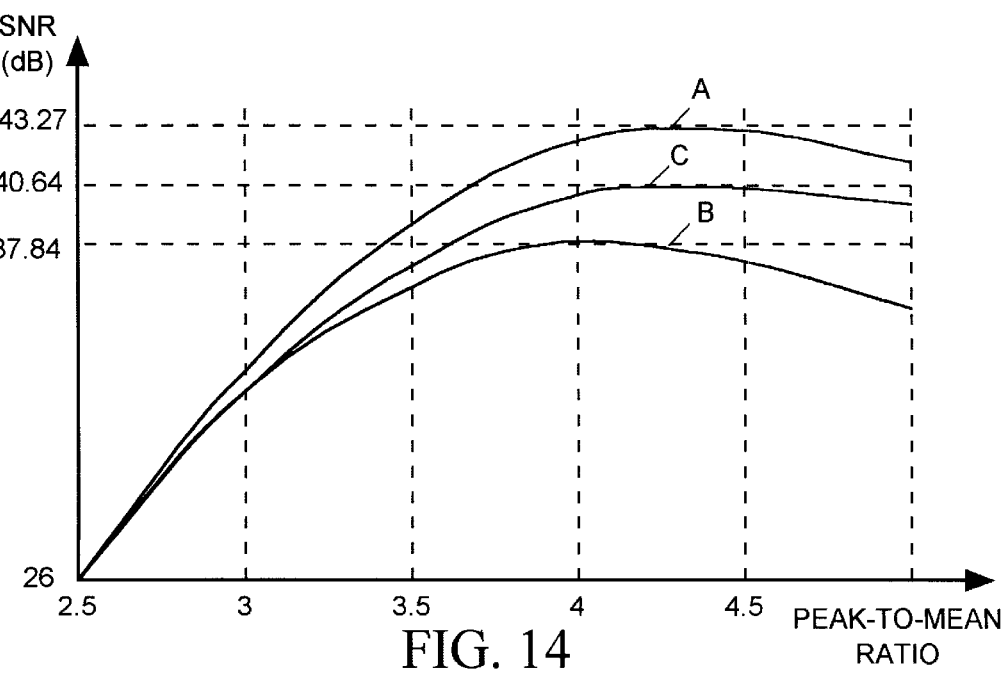
Figure 15:
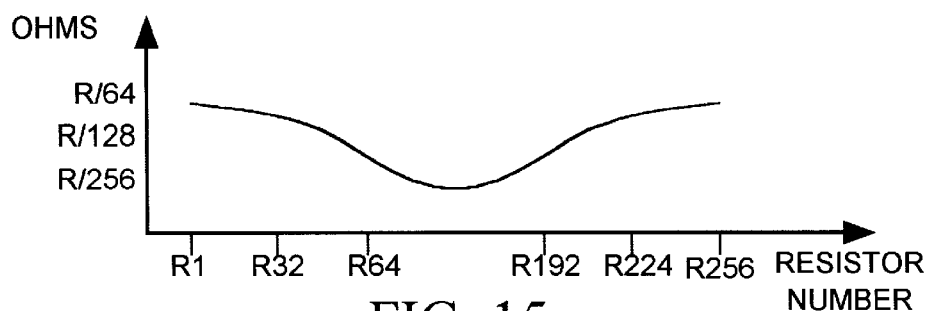
Figure 16:
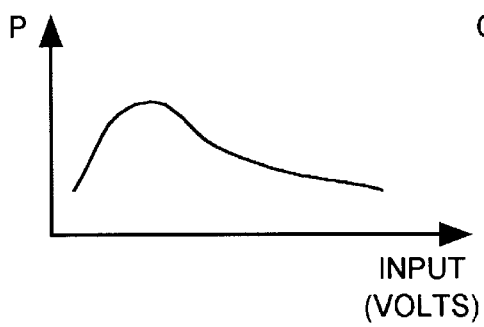
Figure 17:
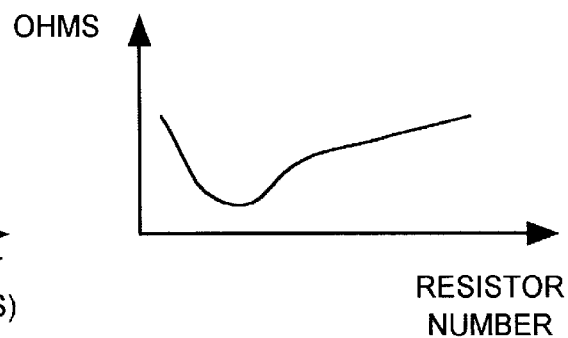
Figure 18:
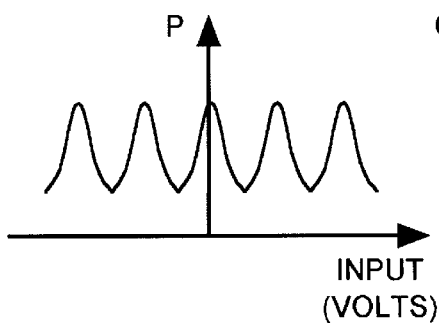
Figure 19:
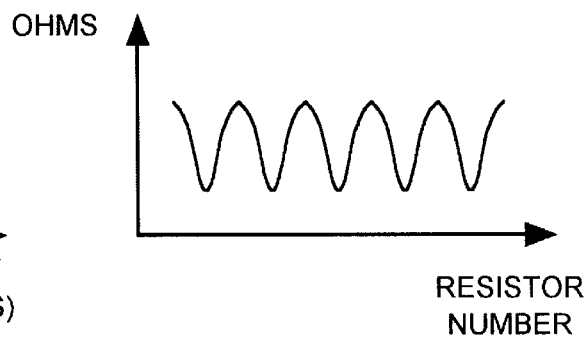
Figure 20:
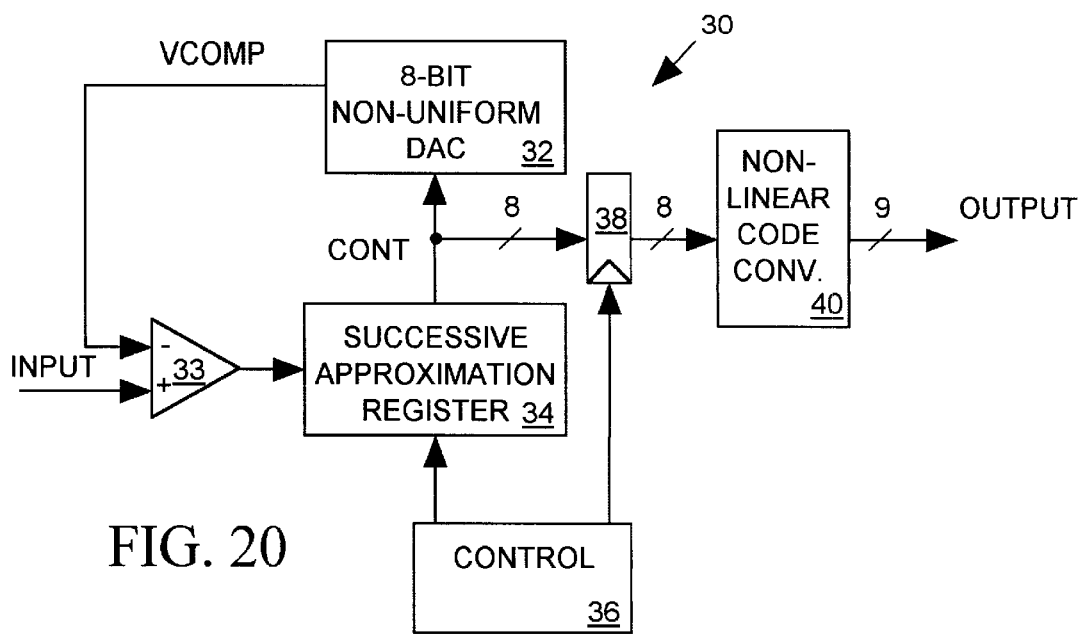
Figure 21:
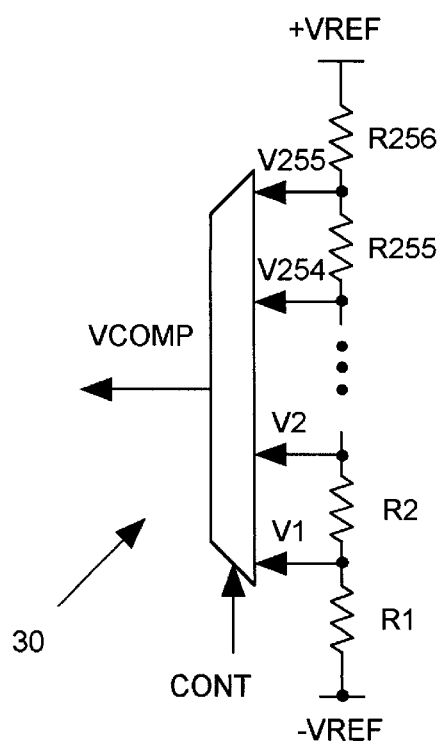

FIG. 1 illustrates a prior art digitizer in combined block and schematic diagram form, FIG. 2 plots the probability of occurrence of signal magnitudes for an analog signal having a uniform probability distribution over a limited range, FIGS. 3 and 4 plot the probability of occurrence of signal magnitudes for signals having normal magnitude probability distributions, FIG. 5 illustrates a digitizer in accordance with the invention in combined block and schematic diagram form, FIG. 6 plots values of the resistors of the analog-to-digital converter (ADC) of FIG. 5 as a function of the resistors' reference characters, FIG. 7 plots voltage magnitudes of the reference signals of FIG. 5 as a function of the reference signals' reference characters, FIG. 8 plots the value of a thermometer code produced by the ADC of FIG. 5 as a function of the ADC's INPUT signal voltage, FIG. 9 plots the value of binary OUTPUT data produced by the thermometer-to-binary code converter of FIG. 5 as a function of the converter's input thermometer code, FIG. 10 plots the value of binary OUTPUT data produced by the digitizer of FIG. 5 as a function of the digitizer's INPUT signal voltage, FIG. 11 plots the quantization step provided by the ADC of FIG. 5 as a function of the ADC's INPUT signal voltage, FIG. 12 plots the quantization noise in the output data produced by the ADC of FIG. 5 as a function of the ADC's INPUT signal voltage, FIG. 13. plots the probability of occurrence of signal magnitudes for an ADC input signal having normal magnitude probability distribution for which the ADC of FIG. 5 exhibits the quantization noise of FIG. 12, FIG. 14 plots ADC signal-to-noise ratio as a function of peak-to-mean ratio for three ADCs including the ADCs of FIGS. 1 and 5, FIG. 15 plots an alternative resistance distribution for resistors of the ADC of FIG. 5, FIG. 16 plots a skewed magnitude probability distribution, FIG. 17 plots an alternative resistance distribution for resistors of the digitizer of FIG. 5 suitable for use when the digitizer is to digitize a signal having the skewed magnitude probably distribution illustrated in FIG. 16, FIG. 18 plots the magnitude probability distribution for a pulse amplitude modulated signal, FIG. 19 plots an alternative resistance distribution for resistors of the digitizer of FIG. 5 when the digitizer is to digitize a signal having the magnitude probability distribution illustrated in FIG. 18, FIG. 20 illustrates a digitizer in accordance with an alternative embodiment of the invention in block diagram form, and FIG. 21 illustrates in block and schematic diagram form, a non-uniform digital-to-analog converter (DAC) suitable for use in digitizer of FIG. 20.

DETAILED DESCRIPTION OF THE INVENTION

The present invention is directed to an analog-to-digital converter (ADC), and this specification describes an exemplary embodiment and/or application of the invention considered by the applicant(s) to be the best mode of practicing the invention.

FIG. 5 depicts in combined block and schematic diagram form a digitizer 18 including an ADC 20 in accordance with a preferred embodiment of the invention and a thermometer-to-binary code converter 24. ADC 20 generates a 255-bit output digital thermometer code (D255 . . . D1) that is a non-linear function of the magnitude of an analog input signal (INPUT). Converter 24 responds to each edge of a clock signal (CLK) by converting the thermometer code output of ADC 20 to a 9-bit, binary digital output data (OUTPUT) which is a substantially linear function of the INPUT signal magnitude.

ADC 20 includes a voltage divider 22 formed by a set of 256 resistors R1–R256 linked in series between reference voltages +VREF and −VREF to produce a set of 255 distributed reference voltages V1–V255. Each of a set of 255 comparators C1–C255 compares a corresponding one of reference voltages V1–V255 to the INPUT signal voltage and generates a corresponding one of thermometer code bits D1–D255. Each voltage comparator C1–C255 drives its output data bit to a "1" logic state when the INPUT signal voltage exceeds the comparators input reference voltage V1–V255 and drives its output bit to a "0" logic state when the INPUT signal voltage is lower than its reference voltage. Data bits D0–D255 form a 255-bit thermometer code (D255 . . . D1) representing the voltage of the INPUT signal. In response to each edge of an input clock signal (CLK), thermometer-to-binary code converter 24 converts the 255-bit thermometer code into a 9-bit binary output data OUTPUT value representing the INPUT signal magnitude.

The ADC 20 is topologically similar to the prior art ADC 10 of FIG. 1 but it differs from ADC 10 in one respect. In prior art ADC 10, the 256 resistors of voltage divider 12 all have the same magnitude R and voltage divider 12 produces reference voltages V1–V255 that are uniformly distributed within the range −VREF and +VREF. Thus voltage divider 12 and comparators C1–C255 of ADC 10 provide a linear mapping between the voltage of the INPUT signal and the value of the thermometer code input to thermometer-to-binary code converter 14. In contrast, the 256 resistors R1–R256 of voltage divider 22 of ADC 20 are not all of the same resistance. Therefore the reference voltages V1–V255 voltage divider 22 are non-uniformly distributed within the range −VREF and +VREF, and ADC 20 provides a non-linear mapping between the INPUT signal voltage and its thermometer code output.

FIG. 6 plots the resistance of resistors R1–R256 of FIG. 5 as a function of resistor number. Given a reference resistance R (for example, 10 KOhm), FIG. 6 shows resistors R1–R256 have resistances as follows:

[R1, R31]=R/64
[R32, R63]=R/128
[R64, R191]=R/256
[R192, R223]=R/128
[R224, R256]=R/64.

FIG. 7 plots the voltage of reference voltages V1–V255 of FIG. 5 when resistors R1–R256 have the resistances indicated in FIG. 6 and when +VREF and −VREF are set to +1 volt and −1 volt, respectively. Reference voltage V1 is 63/64 volt, reference voltage V128 is 0 volts, and reference voltage V255 is +63/64 volt. Note, however, that the reference voltage distribution from V1 through V255 is a piecewise-linear function (a type of non-linear function) of reference voltage number and that the width of the quantization step Δ is not uniform over the entire reference voltage range.

FIG. 8 illustrates the value of the thermometer code (D255 ... D1) output of comparators C1–C255 of FIG. 5 as a function of INPUT signal voltage when voltages V1–V255 are distributed in the manner illustrated in FIG. 7. Note that the thermometer code is a non-linear (piecewise-linear) function of input signal voltage.

For INPUT signal voltages in the ranges −1 to −½ volt or +½ volt to 1 volt, the resolution of ADC 20 is relatively low; a unit change in thermometer code value corresponds to a ¹⁄₆₄ volt change in INPUT signal voltage. This is comparable to the resolution of only a 7-bit ADC having uniform quantization steps.

For INPUT signal voltage in the range of −½ to −¼ volt or +¼ to +½ volt, ADC 20 has a resolution of ¹⁄₁₂₈ volt, comparable to that of an 8-bit ADC having uniform quantization steps. However for INPUT signal voltages in the range −¼ volt to +¼ volt, the resolution with which ADC 20 measures the INPUT signal voltage is relatively high; a unit increase in thermometer code value corresponds to a ¹⁄₂₅₆ volt increase in INPUT signal voltage. Thus in the range −¼ to +¼ volt, the non-uniform ADC 20 has a resolution comparable that of a 9-bit ADC having uniform quantization steps.

FIG. 9 plots the value of the 9-bit OUTPUT data produced by thermometer-to-binary code converter 24 of FIG. 5 as a function of its input thermometer code, and FIG. 10 plots the converter OUTPUT data as a function of INPUT signal voltage. Most applications that make use of an ADC require binary input data that is a linear function of the ADC's INPUT signal voltage as illustrated in FIG. 10. Since the relationship between INPUT signal voltage and thermometer. code value (D255 ... D1) is non-linear, thermometer-to-binary code converter 24 implements a non-linear (piecewise-linear) thermometer-to-binary code mapping illustrated in FIG. 9 which results in the desired linear mapping between INPUT voltage to OUTPUT data illustrated in FIG. 10.

Since the 9-bit binary OUTPUT data of converter 24 has 512 possible values while its 255-bit thermometer code input has only 256 possible values, the converter's thermometer code input values will map to only half of the binary OUTPUT code values. OUTPUT code values in the ranges 1–63 and 192–255 correspond to voltages in the ranges −1 to −¼ and +¼ to 1 volts where ADC resolution is relatively low, and in these ranges not every OUTPUT data code value maps to a thermometer code value. However every OUTPUT code value in the range 64–192 represents a separate INPUT signal voltage in the range −¼ to +¼ volts where ADC resolution is high, and every OUTPUT code in that value maps to a corresponding thermometer code value. Thus most of the time the INPUT signal voltage will be in the range −¼ to +¼ volts and the digitizer OUTPUT data will represent the INPUT signal magnitude with a resolution that is identical to that of a conventional 9-bit digitizer employing an ADC having uniform quantization steps.

FIGS. 11 and 12 respectively plot the quantization step Δ and quantization noise of ADC 20 as functions of INPUT signal voltage when ADC 20 has the non-uniform reference voltage distribution of FIG. 7. Since quantization step size Δ is small in the range −¼ to +¼ volt, the quantization noise for INPUT signal voltages in that range is small. For INPUT signal voltages outside that range, quantization step size Δ is larger, and so too is quantization noise. ADC 20 is particularly suited for digitizing an INPUT signal having normal magnitude probability distribution, for example as illustrated in FIG. 13. Most of the time, an INPUT signal having the distribution illustrated in FIG. 13 will have a magnitude in the range −¼ to +¼ volt where quantization noise is relatively small, similar to that of a conventional 9-bit ADC. Only during the relatively infrequent times when the INPUT signal magnitude goes outside the range −½ to +½ volts will the quantization noise be larger than that of the conventional 8-bit ADC of FIG. 1.

FIG. 14 plots the signal-to-noise ratio (SNR) of three ADC's as functions of INPUT signal peak-to-mean ratio. An INPUT signal's "peak-to-mean" ratio is the ratio of its peak amplitude to its root mean square (RMS) amplitude. Plot A shows the SNR for a conventional 9-bit ADC employing uniformly distributed reference voltages, plot B illustrates the SNR the conventional uniform 8-bit ADC 10 of FIG. 1, and plot C shows the SNR for the piecewise linear, non-uniform ADC 20 of FIG. 5. A maximum SNR of 37.8 dB can be achieved for a uniform 8-bit ADC (plot B) for INPUT signals having a 3.8 peak-to-mean ratio. The maximum attainable SNR for the non-uniform 8-bit ADC (plot C) is 40.64 dB for signals having a 4.2 peak-to-mean ratio, fairly close to the 43.27 dB SNR a conventional 9-bit ADC (plot A) can provide for an INPUT signal having a 4.2 peak-to-mean ratio. FIG. 14 shows that the SNR for the 8-bit non-uniform ADC of FIG. 5 is substantially higher than that of the uniform 8-bit ADC of FIG. 1 for INPUT signals having peak-to-mean ratios greater than 4, and is closer to the SNR of a conventional, uniform 9-bit ADC for signals having high peak-to-mean ratios.

Alternative Embodiments of the Invention

Thus has been shown and described a digitizer 18 including a piecewise-linear, non-uniform ADC 20 in accordance with a preferred embodiment of the present invention. While the best mode of practicing the invention has been shown and described above those of skill in the art will appreciate that many modifications may be made to the ADC disclosed herein without departing from the invention. For example while for illustrative purposes, the range of ADC 20 has been described as extending between −1 volt and +1 volt and centered about 0, volts, those of skill in the art will appreciate that −VREF and +VREF may be set to other voltages and that the range they define may center about a voltage other than 0. Also while an 8-bit digitizer 18 has been described including an ADC 20 producing a 255 bit thermometer code, the invention may be practiced in connection with higher and lower resolution digitizers and ADCs.

An ADC in accordance with the invention compares the magnitude of an analog signal to a magnitude of each of several reference signals to determine a first magnitude range bounding the magnitude of the analog signal, wherein magnitudes of the reference signals are non-uniformly distributed over a second magnitude range −VREF to +VREF. Reference signal magnitudes are considered as being "distributed over a range" if they all have different values within that range, and reference values are considered "non-uniformly distributed" over a range when the difference between neighboring magnitudes is not constant over the entire range. The stepped resistance distribution of FIG. 6 and the piecewise-linear reference voltage distribution illustrated in FIG. 7 are merely exemplary; the invention is not limited to those particular non-uniform resistance and reference voltage distributions. For example, the steps in resistor values could be smaller and more numerous. In alternative embodiments of the invention, resistance values may have other types of non-uniform distributions, for example as depicted in FIG. 15. The shape of the resistance distribution, and therefore the shape of the reference voltage distribution can be adjusted to suit the nature of the shape of the INPUT signal magnitude probability distribution. For example, for an INPUT signal having the skewed magnitude probability distribution illustrated in FIG. 16, resistors R1–R256 may have the skewed resistance distribution shown in FIG. 17, or a stepwise approximation thereof.

Pulse amplitude modulated (PAM) signals employing discrete voltage levels to represent data values tend to spend more time near those discrete levels, and visit intermediate levels only briefly when transitioning between those particular voltage levels. FIG. 18 illustrates the magnitude probability distribution for a five-level PAM signal. The probability P of the signal being of a particular magnitude increases with the inverse of the difference between that magnitude and the nearest discrete level. FIG. 19 illustrates a suitable distribution for resistors R1–R256 for adapting ADC 20 of FIG. 5 to digitize a PAM signal having the magnitude probability distribution illustrated in FIG. 18. A stepwise approximation of the distribution of FIG. 19 would also be suitable.

Those of skill in the art will also appreciate that while the invention is illustrated herein above as being employed in connection with a parallel-encoded "flash" ADC, it may also be practiced in connection with other types of ADCs. For example FIG. 20 illustrates a successive approximation type ADC 30 in accordance with the invention employing an 8-bit non-uniform DAC 31 to supply a reference voltage VCOMP as input to a comparator 33. Comparator 33 provides an indicating signal to a successive approximation register (SAR) 34 indicating whether an analog INPUT is higher or lower in magnitude than VCOMP. After receiving a start signal from a control circuit 36, SAR 34 increments 8-bit control data (CONT) when VCOMP is lower than INPUT and decrements the CONT data when VCOMP is higher than INPUT. The 8-bit CONT data value, supplied as input to DAC 31, controls the magnitude of VCOMP. When the CONT data value has had a fixed period of time to settle to a level at which VCOMP matches INPUT, control circuit 36 latches the 8-bit CONT data onto a non-linear code converter 40 which converts the 8-bit data into 9-bit OUTPUT data. ADC 30 is suitable for use when the INPUT signal magnitude is relatively stable for a sufficient amount of time to allow the CONT data to settle, as for example when the INPUT signal is being produced by a sample and hold circuit periodically sampling a continually varying analog signal.

In accordance with the invention, DAC 31 provides an output VCOMP that is a non-linear function of VCOMP such that the resolution with which the CONT data controls VCOMP is higher for mid-range values of VCOMP than for values at opposing ends of the range of VCOMP. Code converter 40 maps the 8-bit CONT data into 9-bit OUTPUT data in a complementary non-linear fashion so that the OUTPUT data value is a linear function of INPUT signal magnitude.

FIG. 21 illustrates DAC 31 of FIG. 16. in more detail. DAC 31 includes a set of resistors R1–R256 connected between voltage sources −VREF and +VREF to provide a set of reference voltages V1–V255 as inputs to an analog multiplexer or switch network 50 controlled by the input CONT data. The CONT data signals multiplexer 50 to select one of reference voltages V1–V255 as the DAC's output VCOMP voltage. Values of resistors R1–R256 are adjusted, for example as illustrated in FIG. 6 to provide a suitable non-uniform relationship between the value of CONT and the magnitude of VCOMP.

While FIG. 21 illustrates an example of a non-uniform DAC that may implement DAC 31 of FIG. 16, those of skill in the art will appreciate that other types of DACs conventionally providing a uniform, linear mapping between input control data and output signal magnitude can be adapted to provide the non-uniform CONT data to VCOMP mapping of DAC 31.

The forgoing specification and the drawings depict the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps depicted in the specification and drawings. Accordingly should any appended claim describe an element or step only in terms of its function, then it is intended that the claim's description of the element be interpreted as reading on any element or step having the described function, regardless of any structural limitations associated with any example depicted in this specification or in the drawings.

What is claimed is:

1. A method for generating digital data representing a magnitude of an analog signal within a first magnitude range, the method comprising the steps of:
   a. comparing the magnitude of the analog signal to a magnitude of each of plurality of reference signals to determine a second magnitude range bounding the magnitude of the analog signal, wherein magnitudes of the reference signals are non-uniformly distributed over the first magnitude range,
   b. generating first digital data having a value representing the second magnitude range, and
   c. converting the first digital data to second digital data, wherein the second digital data has a value that is a linear function of the magnitude of the analog signal.

2. The method in accordance with claim 1 wherein the value of the first digital data is a substantially non-linear function of the magnitude of the analog signal.

3. The method in accordance with claim 1 wherein the value of the first digital data is a piecewise-linear function of the magnitude of the analog signal.

4. The method in accordance with claim 1 wherein the second digital data has a wider range of values than the first digital data.

5. The method in accordance with claim 1 wherein the first digital data is in a form of a digital thermometer code and wherein the second digital is in a form of a binary code.

6. The method in accordance with claim 5 wherein the thermometer code is no greater than $2^B$ bits wide and the binary code is at least B+1 bits wide, where B is an integer greater than 1.

7. The method in accordance with claim 1 wherein the a digital data is a B-bit binary code and the second digital data is a binary code having more than B bits, where B is an integer greater than 2.

8. The method in accordance with claim 1 wherein step a comprises the substeps of:
   a1. generating the plurality of reference signals, and
   a2. concurrently comparing the magnitude of each reference signal to the magnitude of the analog signal and producing a separate bit of the first digital data corresponding to each reference signal indicating whether the magnitudes of the corresponding reference signal exceeds the magnitude of the analog signal.

9. The method in accordance with claim 1 wherein step a comprises the substeps of:
   a1. setting the first digital data to an initial value,
   a2. selecting one of the plurality of reference signals in accordance with the value of the first digital data,
   a3. Comparing the magnitude of the selected reference signal to the magnitude of the analog signal and altering the value or of the first digital data in a direction determined by whether the magnitude of the reference signal selected by the first digital data exceeds the magnitude of the analog signal, and
   a4. repeating steps a2 and a3.

10. The method in accordance with claim 1
    wherein the first magnitude range includes a high probability portion and a low probability portion;
    wherein a probably of occurrence of each analog signal magnitude residing within the high probably portion is substantially higher than a probability of occurrence of each analog signal magnitude residing within the low probability portion;
    wherein magnitudes of some of the reference signals reside within the high probability portion, and wherein magnitudes of others of the reference signals reside within the low probability portion; and
    wherein spacing between nearest reference signal magnitudes residing within the high probability range is smaller than spacing between nearest reference signal magnitudes residing with the low probability range.

11. The method in accordance with claim 1 wherein the value of the first digital data is a substantially non-linear function of the magnitude of the analog signal;
    wherein a range of values of the second digital data exceeds a range of values of the first digital data;
    wherein the first digital data is in a form of a digital thermometer code and wherein the second digital is in a form of a binary code,
    wherein the first range includes a high probability portion and a low probability portion;
    wherein a probably of occurrence of each analog signal magnitude residing within the high probably portion is substantially higher than a probability of occurrence of each analog signal magnitude residing within the low probability portion;
    wherein magnitudes of some of the reference signals reside within the high probability portion, and wherein magnitudes of others of the reference signals reside within the low probability portion; and
    wherein spacing between nearest reference signal magnitudes residing within the high probability range is smaller than spacing between nearest reference signal magnitudes residing with the low probability range.

12. The method in accordance with claim 11 wherein step a comprises the substeps of:
    a1. generating the plurality of reference signals, and
    a2. concurrently comparing the magnitude of each reference signal to the magnitude of the analog signal and producing a separate bit of the first digital data corresponding to each reference signal indicating whether the magnitudes of the corresponding reference signal exceeds the magnitude of the analog signal.

13. An apparatus for producing digital data representing an instantaneous magnitude of an analog signal that varies in magnitude over time over a first range with a substantially non-uniform probability distribution over the first range, the apparatus comprising:
    a reference signal source for generating a plurality of reference signals, wherein magnitudes of the reference signals are non-uniformly distributed over the range;
    a plurality of comparators, each corresponding to a separate one of the reference signals for comparing the instantaneous magnitude-of the analog signal to the magnitude of its corresponding reference signal to produce a data bit indicating whether the magnitude of the analog signal exceeds the magnitude of the reference signal, wherein data bits produced by all of the comparators form together form first digital data having a value representing the instantaneous magnitude the analog signal;

a data converter for producing second digital data in response to the first digital data, wherein a value of the second digital data is a substantially linear function of the magnitude of the analog signal.

14. The apparatus in accordance with claim 13 wherein the value of the first digital data is a substantially non-linear function of the magnitude of the analog signal.

15. The apparatus in accordance with claim 13 wherein the value of the first digital data is a substantially piecewise-linear function of the magnitude of the analog signal.

16. The apparatus in accordance with claim 13 wherein the first digital data is a thermometer code and the second digital data is a binary code.

17. The apparatus in accordance with claim 13 wherein the reference signal source comprises:

a first voltage source, a second voltage source, and a plurality of resistors connected between the first voltage source and the second voltage source to form a voltage divider providing the reference signals.

18. The apparatus in accordance with claim 18 wherein the magnitudes of the reference signals are voltage magnitudes, and wherein the plurality of resistors have resistances sized so that reference signal voltage magnitudes are non-uniformly distributed with a range bounded by voltages of the first and second voltage sources.

19. The apparatus in accordance with claim 13 wherein the first range includes a high probability portion and a low probability portion;

wherein a probably of occurrence of each analog signal magnitude residing within the high probably portion is substantially higher than a probability of occurrence of each analog signal magnitude residing within the low probability portion;

wherein magnitudes of some of the reference signals reside within the high probability portion, and wherein magnitudes of others of the reference signals reside within the low probability portion; and wherein spacing between nearest reference signal magnitudes residing within the high probability range is smaller than spacing between nearest reference signal magnitudes residing with the low probability range.

20. The apparatus in accordance with claim 13 wherein the first range includes a high probability portion and a low probability portion;

wherein a probably of occurrence of each analog signal magnitude residing within the high probably portion is substantially higher than a probability of occurrence of each analog signal magnitude residing within the low probability portion;

wherein magnitudes of some of the reference signals reside within the high probability portion, and wherein magnitudes of others of the reference signals reside within the low probability portion; and wherein the first digital data represents the magnitude of the analog signal with relatively higher resolution when it resides within the high probability portion than when it resides within the low probability portion.

* * * * *